United States Patent [19]

Zhang et al.

[11] Patent Number: 5,523,240
[45] Date of Patent: Jun. 4, 1996

[54] METHOD OF MANUFACTURING A THIN FILM TRANSISTOR WITH A HALOGEN DOPED BLOCKING LAYER

[75] Inventors: Hongyong Zhang, Kanagawa; Shunpei Yamazaki, Tokyo, both of Japan

[73] Assignee: Semiconductor Energy Laboratory Co., Ltd., Kanagawa-ken, Japan

[21] Appl. No.: 219,286

[22] Filed: Mar. 28, 1994

Related U.S. Application Data

[62] Division of Ser. No. 44,883, Apr. 9, 1993, Pat. No. 5,313,075, which is a continuation of Ser. No. 704,103, May 22, 1991, abandoned.

[30] Foreign Application Priority Data

May 29, 1990 [JP] Japan .................. 2-140580
Oct. 29, 1990 [JP] Japan .................. 2-293264

[51] Int. Cl.⁶ .................. H01L 21/225; H01L 21/268; H01L 21/84
[52] U.S. Cl. .................. 437/21; 437/40; 437/174; 437/240; 148/DIG. 118
[58] Field of Search .................. 437/21, 40, 41, 437/233, 235, 238, 174, 240; 148/DIG. 1, DIG. 4, DIG. 90, DIG. 118, DIG. 150

[56] References Cited

U.S. PATENT DOCUMENTS 3,933,530  1/1976  Mueller et al. .................. 357/91

(List continued on next page.)

FOREIGN PATENT DOCUMENTS

| 2573916 | 5/1986 | France . | |
|---|---|---|---|
| 60-18913 | 1/1985 | Japan .................. | 148/DIG. 90 |
| 60-43869 | 3/1985 | Japan . | |
| 60-245174 | 12/1985 | Japan . | |
| 61-183970 | 8/1986 | Japan . | |
| 62-39068 | 2/1987 | Japan . | |
| 62-211165 | 9/1987 | Japan . | |
| 62-285470 | 12/1987 | Japan . | |
| 62-285469 | 12/1987 | Japan . | |
| 135959 | 2/1989 | Japan . | |
| 1-187814 | 7/1989 | Japan . | |
| 1-283873 | 11/1989 | Japan . | |
| 277127 | 3/1990 | Japan . | |
| 2-159069 | 6/1990 | Japan . | |
| 2-148831 | 6/1990 | Japan . | |
| 2-303030 | 12/1990 | Japan . | |
| 2169442 | 7/1986 | United Kingdom . | |

OTHER PUBLICATIONS

S. Wolf & R. N. Tauber, "Silicon Processing for the VLSIESA", Lattice Press, 1986, pp. 168–169, 198–199, 334–335.
J. Nulman, et al., IEEE Electron Dev. Lett., EDL6, #5, 1985 pp. 205–207, "RTP of Thin Gate Dielectrics".
K. B. Kadyrakunon, et al., Phys. Stat. Sol., a70, (1982), p. K15 ". . . Pulsed Annealing of Si–SiO$_2$ Interfaces".
D. L. Crostuwait, et al., Laser and E–Beam Solid Interactions, Proc. MRS 1980, p. 399, " . . . Laser irradiation . . . Thermal Oxides . . .".
M. Morita et al, Appl. Phys. lett., 49 (86) 699 "F enhanced oxidation of Si Undeu excimen laser . . .".
Japanese Journal of Applied Physics, vol. 27, No. 11, Nov. 1988, pp. L2118–L2120, Tokyo, JP; T. Takeshita et al., "Study of ECR Hydrogen Plasma Treatment on Poly–Si Thin Film Transistors".
S. Gmandmi, VLSI Fabrication Princ., 1983, Wiley & Sons pp. 388–391.

Primary Examiner—Brian E. Hearn
Assistant Examiner—Leon Radomsky
Attorney, Agent, or Firm—Sixbey, Friedman, Leedom & Ferguson; Gerald J. Ferguson, Jr.; Karlton C. Butts

[57] ABSTRACT

A gate-insulated thin film transistor is disclosed. One improvement is that the thin film transistor is formed on a substrate through a blocking layer in between so that it is possible to prevent the transistor from being contaminated with impurities such as alkali ions which exist in the substrate. Also, a halogen is added to either or both of the blocking layer and a gate insulator of the transistor in order that impurities such as alkaline ions, dangling bonds and the like can be neutralized, therefore, the reliability of the device is improved.

14 Claims, 15 Drawing Sheets

U.S. PATENT DOCUMENTS

| | | | |
|---|---|---|---|
| 4,027,380 | 6/1977 | Deal et al. | 357/90 |
| 4,217,194 | 8/1980 | Lubbers et al. | 204/192 SP |
| 4,403,239 | 9/1983 | Yamazaki | 357/2 |
| 4,404,735 | 9/1983 | Sakurai | 29/576 W |
| 4,451,838 | 5/1984 | Yamazaki | 357/2 |
| 4,502,204 | 3/1985 | Togashi et al. | 357/23.7 |
| 4,566,913 | 1/1986 | Brodsky et al. | 148/DIG. 118 |
| 4,585,492 | 3/1986 | Weinberg et al. | 148/DIG. 4 |
| 4,599,135 | 6/1986 | Tsunekawa et al. | 156/643 |
| 4,680,609 | 7/1987 | Calder et al. | 257/69 |
| 4,746,628 | 5/1988 | Takafuji et al. | 357/2 |
| 4,748,131 | 5/1988 | Zeitlow | 148/DIG. 118 |
| 4,851,363 | 7/1989 | Troxell et al. | 437/40 T FT |
| 5,008,218 | 4/1991 | Kawachi et al. | 437/200 |
| 5,060,036 | 10/1991 | Choi | 357/23.7 |
| 5,076,666 | 12/1991 | Katayama et al. | 357/23.7 |
| 5,105,245 | 4/1992 | Riemenschneider et al. | 257/304 |
| 5,233,191 | 8/1993 | Noguchi et al. | 437/8 |
| 5,238,705 | 8/1993 | Hayashi et al. | 427/122 |
| 5,288,684 | 2/1994 | Yamazaki et al. | 118/722 |

METHOD OF MANUFACTURING A THIN FILM TRANSISTOR WITH A HALOGEN DOPED BLOCKING LAYER

This is a Divisional application of Ser. No. 08/044,883, filed Apr. 9, 1993, U.S. Pat. No. 5,313,075, which itself is a continuation of Ser. No. 07/704,103, filed May 22, 1991, now abandoned.

BACKGROUND OF THE INVENTION

This invention relates to a thin-film transistor (from here on will also be referred to as a TFT) which is made of non-single-crystal semiconductor, for example an IG-FET, and its manufacturing process, and in more particular, to a highly reliable thin-film transistor which is suitable for use as a driving element of a display image sensor or liquid crystal device or the like.

Thin-film transistors can be formed by a chemical vapor deposition method on an insulated substrate in a comparatively low temperature atmosphere, with a maximum temperature of 500° C., and the substrate being made of an inexpensive material such as soda glass or boron-silicate glass.

This thin-film transistor is a field-effect transistor and has the same features as a MOSFET. In addition, as mentioned above, it has the advantage that it can be formed on an inexpensive insulated substrate at a low temperature. Also the thin film transistors can be formed on a large substrate by the use of CVD techniques. It is therefore a very good prospect for use as switching elements of a matrix type liquid crystal display having a lot of picture elements, or as switching elements of a one-dimensional or two-dimensional image sensor.

Also, the thin-film transistors can be formed using already established photolithography technology, by which a very minute process is possible, and transistors can be integrated just as making an IC and so on. FIG. 1 shows the construction of a typical prior art TFT.

In FIG. 1, the thin-film transistor is comprised of an insulated substrate 20 made of glass, a semiconductor thin film 21 made of a non-single-crystal semiconductor, a source 22, a drain 23, a source electrode 24, a drain electrode 25, gate insulating film 26, and a gate electrode 27.

In this type of thin-film transistor, the current flow between the source 22 and the drain 23 is controlled by applying a voltage to the gate electrode 27. The response speed of the thin-film transistor is given by the equation;

$$S = \mu \cdot V/L^2$$

where L is a channel length, $\mu$ is a carrier mobility, and V is the gate voltage.

In this type of thin-film transistor, the non-single-crystal semiconductor layer contains many grain boundaries. The non-single-crystal semiconductor, when compared to the single-crystal semiconductor, has disadvantages that the carrier mobility is very low and thus the response speed of the transistor is very slow due to the many grain boundaries. Especially if an amorphous silicon semiconductor is used, the mobility is only about 0.1–1 $(cm^2/V.sec)$ and is too short to function for use as a TFT.

It is obvious that to solve this problem the channel length needs to be shortened and the carrier mobility increased. Many improvements are being made.

When the channel length L is decreased, the effect it has on the response speed is as the square of the length, and so it is a very effective means. However, when forming elements on a large area substrate, it is apparently difficult to use the photolithography technique in order that the space between the source and drain (this is essentially the channel length) should be 10 μm or less, due to the precise process, yield, and manufacturing cost problems. Consequently, effective means for shortening the channel length of the TFT have not been found.

On the other hand, to increase the mobility ($\mu p$) of the semiconductor layer, single-crystal semiconductor or poly-crystal semiconductor material is used, and when using amorphous semiconductor material, after the semiconductor is formed, the active region of the TFT should be crystallized using a process such as heat treatment.

In this case, a temperature higher than what is normally required to form a-Si is necessary. For example;

(1) For a thin-film transistor made of amorphous semiconductor material, the amorphous silicon film is made at a temperature of about 250° C. and then a maximum temperature of 400° C. is required for thermal annealing.

(2) When a poly-crystal silicon film is formed by a low pressure CVD method, the maximum temperature required for forming the film and then for recrystallization is 500° to 650° C.

(3) For a thin-film transistor where only an active layer is converted to a poly-crystalline structure, the required CVD temperature for forming the semiconductor layer is 250° to 450° C., however the temperature exceeds 600° C. during a recrystallization step of the active layer by CW laser.

The TFT is formed on a substrate made of a material such as soda glass and the active region comes in direct contact with the glass substrate, especially in the case of stagger-type and coplanar-type transistors. When making a TFT that has sufficiently fast response speed, the heat treatment mentioned above is necessary, and so the metallic alkali impurities such as sodium and potassium which exist in the glass substrate are externally diffused and forced into the semiconductor layer which forms the active layer or TFT. This lowers the mobility of the semiconductor layer and changes the threshold value, making the characteristics of the device worse and has an adverse effect on the long-term reliability of the device.

Also, through operation of the TFT, the TFT produces heat which causes the temperature of the glass substrate to rise thus causing impurities to be diffused from the substrate, which also has an adverse effect on the TFT.

Generally, a gate-insulator of the IG-FET is made of a silicon oxide film which is formed by a sputtering method with argon (Ar) gas used as a sputtering gas. In the sputtering process, the argon atoms are inherently introduced into the gate insulator and generates a fixed charge in the semiconductor film. Also, ions that exist in a reaction space during the sputtering collide with the surface of the active layer of the thin-film transistor, which causes a damage to the active layer. As a result, a mixed layer of the active layer and the insulation layer is formed in the boundary region of the gate insulation layer and the active layer of the transistor. In producing a TFT as described above, the problems of response speed and reliability need to be solved.

SUMMARY OF THE INVENTION

It is therefore an object of the present invention to produce a high speed TFT which uses non-single-crystal semiconductor. It is another object of the present invention to solve the problem of reliability mentioned above.

In order to solve the above problems, in this invention an insulation layer 500 Å to 5000 Å thick is formed on the glass substrate as a bottom protective film before the TFT elements are formed, and the TFT elements are formed on top of this protective film. In this structure, it is possible to keep the impurities existing in the glass substrate from going into the active layer of a thin-film transistor or into the transistor elements themselves, and to provide a thin-film transistor that has high mutual conductance and high field-effect mobility. Also it suppresses the diffusion of impurities from the substrate which occurs when heat is generated during operation of the device. It also provides a thin-film transistor that can control degeneration of the electrical characteristics and has long-term stability and reliability.

Also by adding a halogen element to the protective film or to the gate insulator, impurities intruded from the outside or impurities in the film can be neutralized. Interface states between the insulation layer and the semiconductor layer can also be reduced by the halogen element. This increases stability and reliability of the TFT.

DETAILED DESCRIPTION OF THE EMBODIMENTS

Below the preferred embodiments of this invention will be used to explain the above and other characteristics of this invention.

Embodiment 1

Figure 1:
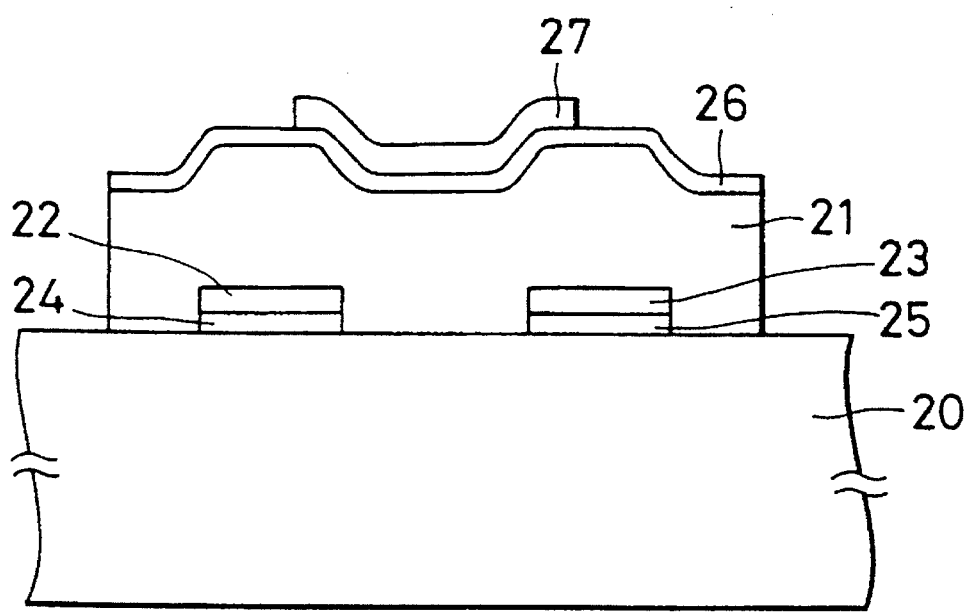
FIG. 1 shows a cross sectional view of a part of a prior art thin film transistor.
Figure 2A:
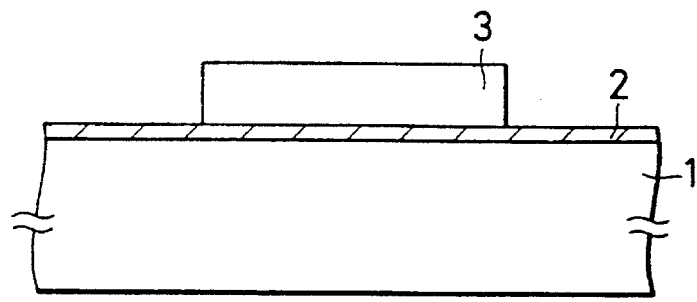
FIGS. 2(A) to 2(C) show a first embodiment of a manufacturing process of a thin-film transistor in accordance with the present invention.
Figure 2B:
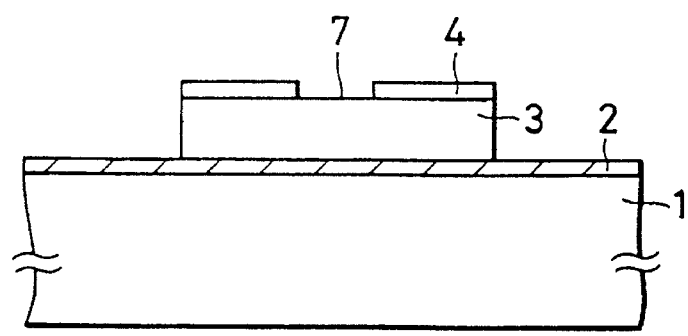
Figure 2C:
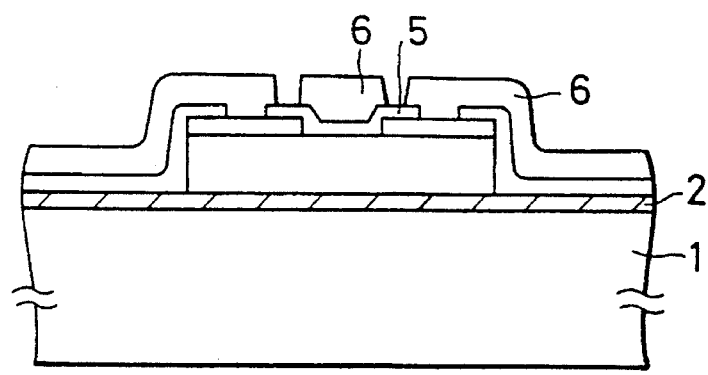

The manufacturing process of the planar type thin-film transistor in accordance with a first embodiment of the present invention is shown in FIG. 2(A) to FIG. 2(C).

First a glass substrate 1 is made of soda glass and on an entire surface of the substrate 1, a 300 nm thick silicon oxide bottom protective film 2 is formed by sputtering. The formation conditions of the film are shown below.

| | |
|---|---|
| Sputtering Gas | oxygen 100% |
| Reaction Pressure | 0.5 Pa |
| RF Power | 400 W |
| Substrate Temperature | 150° C. |
| Film Formation Speed | 5 nm/min |

Next, an approximately 100 nm thick I-type conductivity non-single-crystal silicon semiconductor film 3 is formed by a CVD method on the protective film 2. The manufacturing conditions are shown below.

| | |
|---|---|
| Substrate Temperature | 300° C. |
| Reaction Pressure | 0.05 Torr |
| Rf Power (13.56 MHz) | 80 W |
| Gas Used | SiH$_4$ |

After this, a predetermined etching step is performed, so that the structure shown in FIG. 2(A) is obtained.

Next, in at least one region of the semiconductor film 3 the active layer is formed using an excimer laser to perform laser anneal in this region allowing poly-crystallization. The conditions are as follows.

| | |
|---|---|
| Laser energy density | 200 mJ/cm$^2$ |
| Number of Irradiation Shots | 50 times |

Then a non-single-crystalline silicon layer 4 which has an N-type conductivity is formed on the above structure by a CVD method as a low resistance non-single-crystal semiconductor layer. The formation conditions are as follows.

| | |
|---|---|
| Substrate Temperature | 220° C. |
| Reaction Pressure | 0.05 Torr |
| Rf Power (13.56 MHz) | 120 W |
| Gas Used | SiH$_4$ + PH$_3$ |
| Film Thickness | 1500Å |

When making this N-type non-single-crystal silicon semiconductor layer 4, a large quantity of H$_2$ gas can be used and the RF power can be increased to form micro-crystals which lowers the electrical resistance.

Then, a part of the N-type semiconductor layer 4 is etched by using a photolithography so that it is patterned into source and drain regions 4 and a channel region 7 is defined therebetween as shown in FIG. 2B.

After that, hydrogen plasma processing is performed under the following conditions to activate the channel region 7.

| | |
|---|---|
| Substrate Temperature | 250° C. |
| RF Power | 100 W |
| Processing Time | 60 minutes |

On top of the structure shown in FIG. 2B, a 100 nm thick gate insulation film 5 is formed using the same material and same method as the bottom protective film 2. The contact holes for the source and drain regions are formed using an etching method and then the source, drain, and gate electrodes 6 are formed using aluminum. Through the above process, the IG-FET shown in FIG. 2(C) is made.

In this embodiment, the gate insulation film 5 and the bottom protective film 2 are made of the same material and are made using the same method. Therefore during heat treatment of the thin-film transistor, or when heat is generated during operation of the transistor, there is no difference in the heat expansion of the two and so there is no breakage or pealing of the aluminum or metal electrodes on top, giving the transistor long-term reliability.

Embodiment 2

Figure 3A:
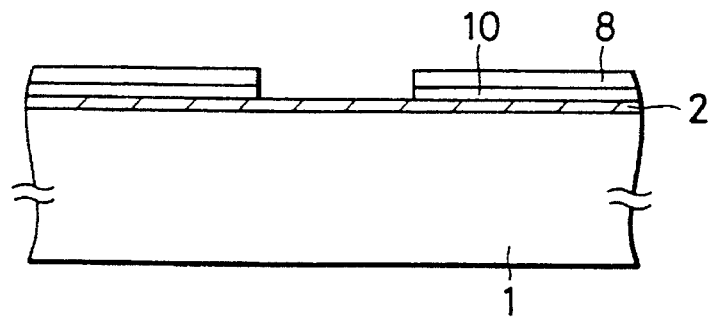
FIGS. 3(A) to 3(C) show a second embodiment of a manufacturing process of the thin-film transistor in accordance with the present invention.
Figure 3B:
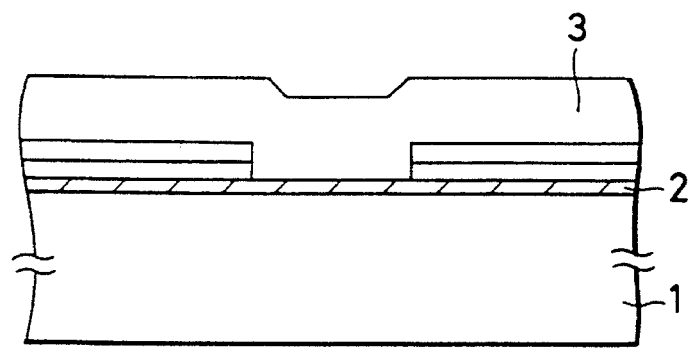
Figure 3C:
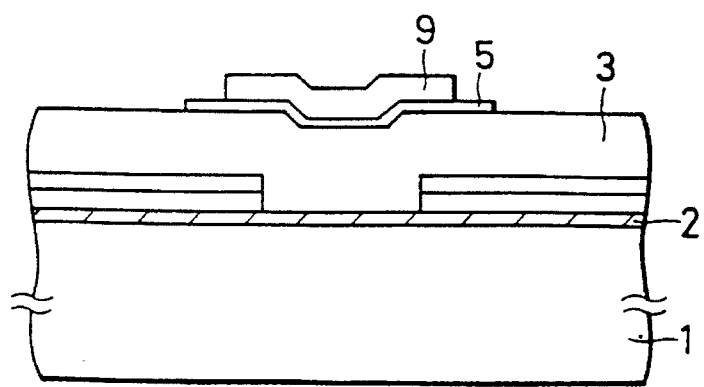

FIGS. 3A to 3C show a manufacturing process of an IG-FET in accordance with a second embodiment of the present invention. First, a 500 Å to 5000 Å thick silicon oxide film 2 is formed by a sputtering method on top of the soda glass substrate 1 as a protective film in a same manner as in Embodiment 1. Next, on the bottom protective film 2, a 200 nm thick molybdenum metallic layer 10 is formed. Formed on top of this structure is a non-single-crystal silicon film 8 which has a P-type conductor and has a low resistance. The formation conditions this time are as follows.

| Substrate Temperature | 230° C. |
|---|---|
| Reaction Pressure | 0.05 Torr |
| Rf Power (13.56 MHz) | 150 W |
| Gas Used | $Si_4 + B_2H_6$ |
| Film Thickness | 200Å |

This semiconductor layer can have ohmic contact with the I-type semiconductor layer that will be formed later in the process.

Next, a predetermined pattern is etched, and the structure shown in FIG. 3(A) is obtained. On top of this structure, a 200 nm thick I-type non-single-crystal silicon semiconductor film 3 is formed by a sputtering method. The formation conditions are as follows.

| Substrate Temperature | 250° C. |
|---|---|
| Reaction Pressure | 0.2 Pa |
| Rf Power (13.56 MHz) | 80 W |
| Gas Used | Ar |

Then, using the same process as described in Embodiment 1, the I-type semiconductor layer 3 is heat treated causing polycrystallization and using a hydrogen plasma process it is activated and the structure shown in FIG. 3(B) is obtained.

Further, $SiO_2$ is formed by sputtering to be 100 nm thick as a gate insulator 5 in the same manner as in the Embodiment 1, after which molybdenum gate electrode 9 is formed in the predetermined pattern. Thus a thin-film transistor is formed as shown in FIG. 3(C).

In this embodiment, because there is a metallic electrode underneath the low resistance semiconductor layer 8, the wire resistance is very low. For a TFT that is used as the switching element of a large area liquid crystal device, if the wire resistance is low, the drive signal wave form is not distorted and the liquid crystal device can be driven at a high speed.

The silicon oxide film of this embodiment is formed using the sputtering method but may also be formed using photo CVD, plasma CVD, or thermal CVD.

Embodiment 3

This embodiment will be explained referring to FIG. 4(A) to FIG. 4(D). In this embodiment a halogen element is added to the protective film on the glass substrate or to the gate insulator of the IG-FET or more preferably to the both.

Figure 4A:
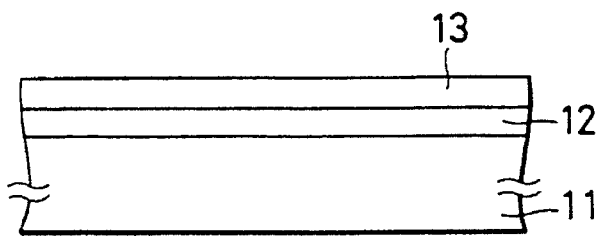
FIGS. 4(A) to 4(D) show a third embodiment of a manufacturing process of the thin-film transistor in accordance with the present invention.

In FIG. 4(A) a b 200nm thick $SiO_2$ film 12 is formed on a glass substrate 11 using a magnetron-type RF sputtering method with the following formation conditions.

| Reaction Gas | $O_2$ 95% volume |
|---|---|
| | $NF_3$ 5% volume |
| Film Formation Temperature | 150° C. |
| RF Power (13.56 MHz) | 400 W |
| Pressure | 0.5 Pa |
| Silicon is used as a target. | |

On top of this film 12, a 100 nm thick a-Si film 13 is formed by a magnetron RF sputtering in order to form a channel region, so that the structure shown in FIG. 4(A) is obtained. The film formation is done in an atmosphere of inert gas of argon and hydrogen and in the conditions shown below.

| $H_2/(H_2 + Ar)$ = 80% (partial pressure ratio) | |
|---|---|
| Film Formation Temperature | 150° C. |
| RF Power (13.56 MHz) | 400 W |
| Total Pressure | 0.5 Pa |
| Single crystal silicon is used as the target. | |

After this, at a temperature of 450° C. to 700° C. for example at 600° C. and in an atmosphere of hydrogen or inactive gas, in this embodiment 100% nitrogen is used, the a-Si film 13 is heat-crystallized for 10 hours, so that a silicon semiconductor layer having a high crystallinity is obtained. Besides, if a non-single crystalline silicon target is used and the input power is lowered, the crystal size becomes smaller and the crystalline condition becomes dense and therefore the subsequent heat-crystallization of the film will be facilitated.

Figure 4B:
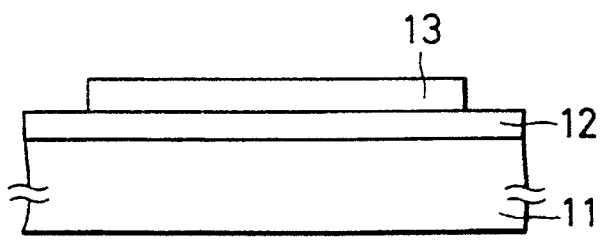

Patterning is performed on this heat crystallized silicon semiconductor, and the structure shown in FIG. 4(B) is obtained. In a portion of the semiconductor layer 13, the channel formation region of the insulated-gate semiconductor will be formed.

Next, a 100 nm thick silicon oxide film ($SiO_2$) 15 is formed by the magnetron-type RF sputtering method in the following formation conditions.

| Oxygen | 95% volume; | $NF_3$ | 5% volume |
|---|---|---|---|
| Pressure | 0.5 Pa | | |
| Film Formation Temperature | 100° C. | | |
| RF Power (13.56 MHz) | 400 W | | |
| A silicon target or synthetic quartz target is used. | | | |

If an amorphous silicon target is used and the applied power is lowered, a densified silicon oxide film is obtained where it is difficult for a fixed charge to exist.

When the silicon oxide film used in this invention, for example the gate insulation film, is formed using the sputtering method, it is preferable that the percentage of the inert gasses is lower than 50% with respect to the halogen and oxide gasses, desirably no inert gas.

Also, if a halogen containing gas is mixed with an oxygen containing gas at 2–20% volume, it is possible to neutralize the alkali ions that are incidentally mixed into the silicon oxide film 15, and at the same time makes it possible to neutralize the silicon dangling bonds.

Figure 4C:
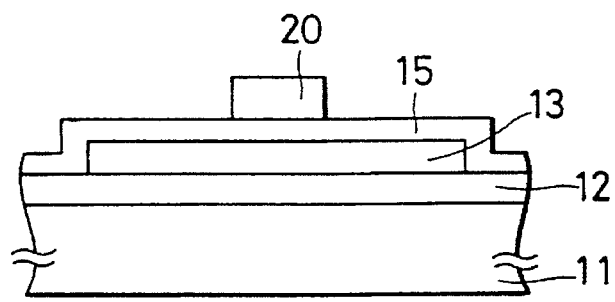

On the silicon oxide film 15 is formed a semiconductor layer e.g. Si by sputtering, CVD or the like, doped with an impurity e.g. phosphorous for giving one conductivity type thereto, following which the layer is patterned in accordance with a prescribed mask pattern so that a gate electrode 20 is formed as shown in FIG. 4C. The gate electrode 20 is not limited to a doped semiconductor but metals or other materials may also be used.

Next, using the gate electrode 20 or a mask on top of the gate electrode 20, self-aligning impurity regions 14 and 14' are formed by ion implantation. In so doing, the semiconductor layer 17 underneath the gate electrode 20 is made into a channel region of the insulated-gate type semiconductor device.

After an insulating layer 18 is formed to cover the entire surface of the above structure, holes are made in the layer 18 for source and drain electrode contacts and on these holes an aluminum film is formed by sputtering, and then by using a predetermined pattern, the source electrode 16 and the drain electrode 16' are formed whereby the insulated-gate type semiconductor device is completed.

In this invention, the semiconductor layer that forms the channel region 17 and the semiconductor layers that form the source 14 and the drain 14' are made of the same material simplifying the manufacturing process. Also, semiconductor is crystallized in the source and drain regions as well as in the channel region, thus the carrier mobility is enhanced, which makes it possible to make an insulated-gate type semiconductor device that has high electrical characteristics.

Finally, this embodiment is completed by performing hydrogen thermal anneal in a 100% hydrogen atmosphere, at a temperature of 375° C. for 30 minutes. This hydrogen thermal anneal lowers the grain boundary potential in the poly-crystalline semiconductor improving the characteristics of the device.

Figure 4D:
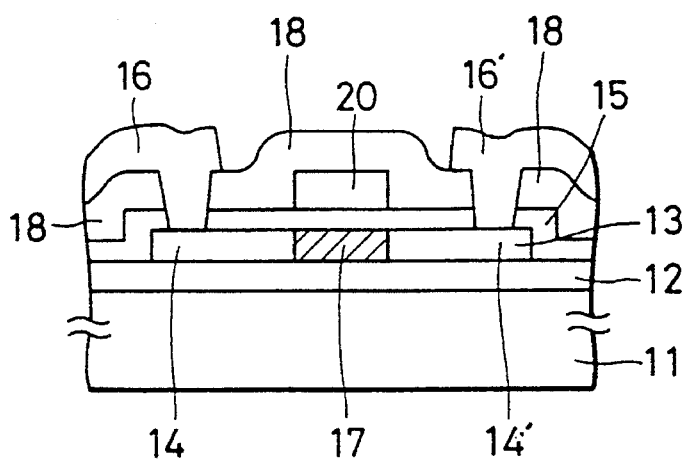

The size of the channel 17 of the thin-film transistor shown in FIG. 4(D) of this embodiment is 100×100 μm.

As explained in the above, the thin film transistors are formed using the poly-crystalline semiconductor in this embodiment.

For the sputtering method used in this embodiment, either RF sputtering or direct-current sputtering can be used, however, if the sputter target is made of an oxide with poor conductivity such as $SiO_2$, in order to maintain a constant electrical discharge, the RF magnetron sputtering method is desired.

The oxide gas can be oxygen, ozone, or nitrous oxide, however, if ozone or oxygen is used, the silicon oxide film does not take in unnecessary atoms making it possible to obtain a very good insulation film, for example the gate insulation film. Also it is easy to decompose ozone into O radical and so the number of O radical generated in a unit area is large contributing to the improvement of the film formation speed.

The halogen containing gas can be fluoride gas such as nitrogen fluoride ($NF_3$, $N_2F_4$), or hydrogen fluoride gas such as (HF), fluorine gas ($F_2$) or fleon gas. The $NF_3$ gas easy to chemically decompose and to handle is desirable. For chlorine gas, it can be carbon chloride ($CCl_4$), chlorine ($Cl_2$), or hydrogen chloride (HCl). The quantity of halogen gas, for example nitrogen fluoride, is 2 to 20% volume with respect to the quantity of the oxide gas, for example oxygen. The halogen elements, during heat treatment, neutralize the alkali ions such as sodium in the silicon oxide and has an effect on neutralizing the silicon dangling bond, however if the quantity of the halogen elements is too large, the compound $SiF_4$ is formed in the film, which is a gas component and would lower the film quality and therefore is not desired. Normally, the quantity of halogen elements mixed into the film is 0.1 to 5 atomic % with respect to the silicon.

In forming the gate insulation film by the sputtering method as is done in the prior art, the quantity of the inert gas argon is more than oxygen. Conventionally, oxygen is 0 to about 10% volume. In the prior art sputtering method, it is natural to think that the argon gas hits the target material, resulting in that the target grains are generated to form the film on the surface. This is because the probability that the argon gas will hit the target material (sputtering yield) is high. We the inventors, earnestly examined the characteristics of the gate insulation film formed by the sputtering method and found that the shift from the ideal value of flatband voltage, which reflects the number of fixed charges in the gate insulation film, and the interface states between the activation layer and the gate insulation film, indicating the gate insulation film performance, largely depends on the proportion of argon gas in sputtering. The flatband voltage is the voltage required to oppose the effect of the fixed charge in the insulation film, the lower this voltage the better the characteristics of the insulation film are.

Figure 5:
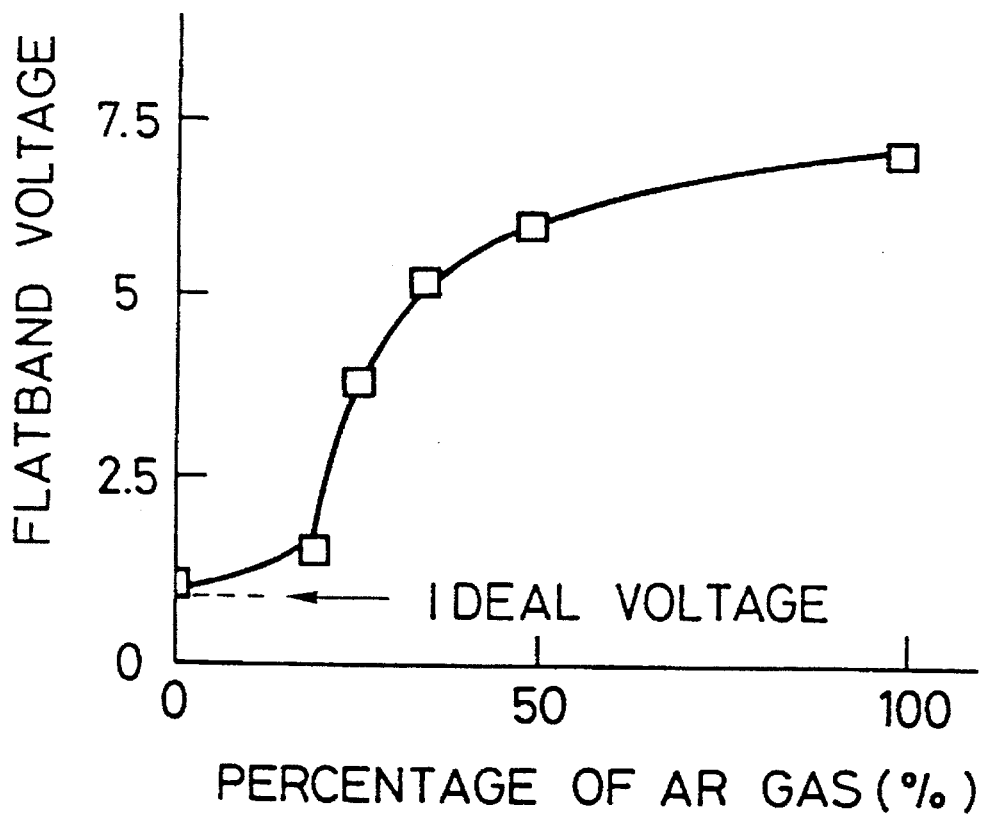
FIG. 5 is a graph to show a relationship between the flatband voltage of an insulation film formed by a sputtering method and the percentage of argon in the sputtering gas.

When the $SiO_2$ film is formed by the sputtering method on the non-single-crystal semiconductor prepared in accordance with the present invention, the relationship between the proportion of argon gas with respect to oxygen and the flatband voltage is shown in FIG. 5. The objects observed in this experiment is prepared in the following manner, an $SiO_2$ film is formed by sputtering on the poly-crystalline semiconductor layer shown in FIG. 4A and then an Al electrode is formed on it by electron beam evaporation.

When the volume of argon is less than that of oxidizing gas (oxygen in the case of FIG. 5), for example 50% or less, the flatband voltage is apparently reduced when compared to 100% argon gas. The shift from the ideal value of the flatband voltage depends largely on the proportion of argon gas. If the percentage of argon gas is less than 20%, the flatband voltage is very close to the ideal voltage. The activated argon atoms in the reactive atmosphere when forming the film by the sputtering method, have an effect on the film quality of the gate insulation film, and so it is desired for the sputtering film forming to lower the amount of argon atoms as much as possible.

The reason is that the film formation surface is damaged by argon ions or by activated argon atoms colliding thereon, which results in forming interface states or fixed charges.

Figure 6:
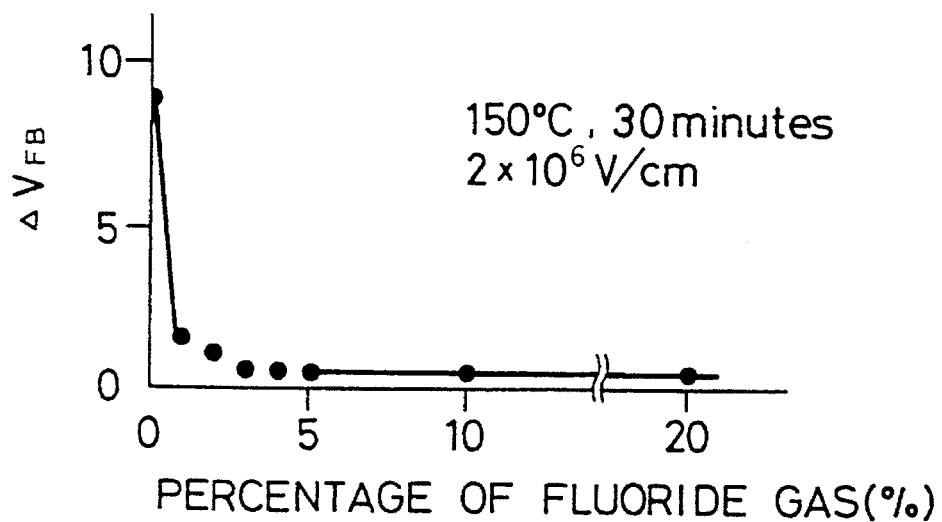
FIG. 6 is a graph to show a relationship between the flatband voltage of the insulation film formed by a sputtering method and the percentage of fluoride gas in the sputtering gas.

FIG. 6 shows the relationship between the shift $\Delta V_{FB}$ from the ideal flatband voltage and the percentage of fluorine with respect to oxygen in the sputtering gas ($O_2/NF_3$ volume %).

In the experiment, a 1 mm diameter aluminum electrode is formed on top of the silicon oxide film 15 doped with, halogen elements on the poly-crystalline silicon semiconductor 13 prepared in accordance with this invention, (FIG. 4A) then a thermal annealing is done at 300° C. followed by a B-T (bias-temperature) process. Further a negative bias voltage of $2\times10^6$ V/cm is applied to the gate electrode at a temperature of 150° C. for 30 minutes, then in the same conditions, a positive bias voltage is applied and in this state the shift of the flatband voltage $\Delta V_{FB}$ is measured.

As can be clearly seen in FIG. 6, when a silicon oxide was formed by a magnetron RF-sputtering in an atmosphere in which $NF_3$ is 0%, $\Delta V_{FB}$ was as much as 9 V. However, if just a few halogen elements such as fluorine are added during film formation, this value is suddenly reduced. This is because the positive sodium ions contaminating the film during formation combine with the fluorine and neutralized as follows:

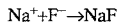

$Na^+ + F^- \rightarrow NaF$

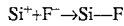

$Si^+ + F^- \rightarrow Si-F$

On the other hand, it is known that adding hydrogen neutralizes the silicon, however, the Si—H bond is likely to be separated again by a strong electric field (BT processing) and causes silicon dangling bonds and causes boundary levels to be formed, and so it is desired to use fluorine for neutralization. Also, there always is a Si—H bond in the silicon oxide film. When this bond is separated again, the fluorine atoms neutralize the separated hydrogen atoms, which is effective in preventing the formation of boundary levels. Moreover, due to the existence of fluorine, the hydrogen bonded to the silicon bonds also with the fluorine, and thus the silicon prevents a fixed charge from developing.

Figure 7:
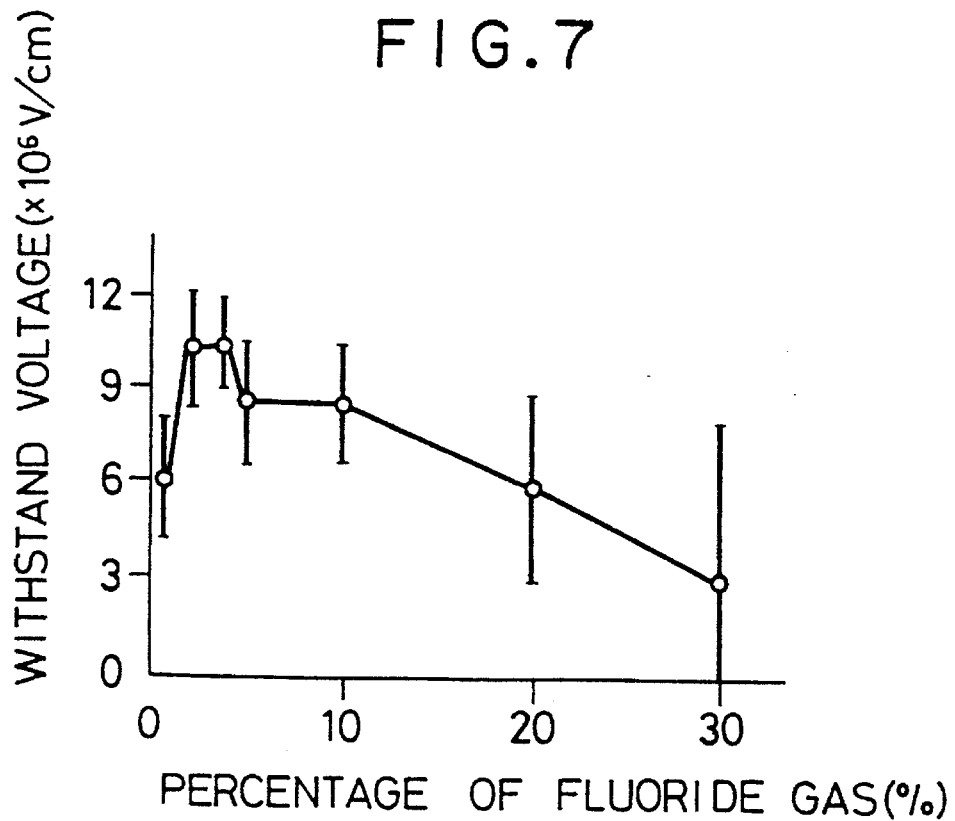
FIG. 7 is a graph to show a relationship between the withstand voltage of the insulation film formed by a sputtering method and the percentage of fluoride gas in the sputtering gas.

FIG. 7 shows the withstand voltage of the $SiO_2$ film when more fluoride gas is added. The withstand voltage is the voltage measured, using a 1 mm diameter aluminum electrode, when the leak current exceeds 1 μA. Depending on the test materials, there is disparity and so in the Figure, the value is shown by X and σ (dispersion sigma value). The withstand voltage becomes lower as the percentage of fluorine gas is increased to more than 20% and the σ value becomes larger. Therefore it is best if the added halogen element is less than 20% volume, normally 2 to 20% is good. Incidentally, when halogen gas was added at 1 volume % with respect to oxygen gas during the film formation, measuring by SIMS (secondary ion mass analysis), it was found that the density of halogen in the film was $2 \times 10^{20}$ atoms/cm$^3$. It was found that when added simultaneously, during the sputtering method of film formation, the fluorine element is very easily taken in by the film. However, if too much is added (more than 20%), the silicon oxide film tends to become porous and degraded because of the formation of $SiF_4$, and as a result the withstand voltage becomes poor and very disperse.

Also, it is desired that the materials used in sputtering be highly pure. For example, a sputtering target made of 4N or more synthetic quartz, or high grade silicon as used for the LSI substrate is very desired. The sputtering gas used is very pure (5N or more), and mixing of impurities with the silicon oxide film is avoided as much as possible.

In this embodiment, the silicon oxide film, which is the gate insulation film formed by the sputtering method in an oxygen atmosphere with fluorine added, is irradiated by an excimer laser, and flash anneal is performed. As a result, it is effective that halogen elements such as fluorine introduced in the film are activated, to neutralize the silicon dangling bonds, so that the cause of the fixed charge in the film is removed. At this time, by selecting a suitable excimer laser power and shot number, activation of both the above halogen element and the semiconductor layer underneath the gate insulation film can be performed simultaneously.

Then, following is an explanation regarding the formation of the a-Si semiconductor layer 13 in FIG. 4(A) by sputtering in an atmosphere with hydrogen added, and its heat recrystallization.

The channel formation region of this embodiment is obtained by applying heat of 450° to 700° C., e.g. 600° C. for crystallization to a non-crystalline, i.e. amorphous or close to amorphous semiconductor (referred as a-Si hereinafter) obtained by the sputtering method in a hydrogen atmosphere or inert gas atmosphere with hydrogen mixed in. The semiconductor after the crystallization had an average grain diameter of about 5 to 400 , and the quantity of hydrogen mixed in the semiconductor film was 5 atomic % or less. Also, the crystals of this semiconductor has a distorted lattice and the boundaries of all of the crystal grains are bonded tightly at a microscopic view point, and the barriers to the carriers in the boundary regions are substantially eliminated. In a conventional poly-crystalline semiconductor without a distorted lattice, impurities such as oxygen tends to be separated at grain boundaries, which forms barriers against carriers, however, in the present invention, the barriers are substantially eliminated by virtue of the distorted lattice and thus the mobility of electrons is 5–300 cm$^2$/V.s, which is very preferable.

Furthermore, in a semiconductor film obtained through the plasma CVD method, the proportion of amorphous elements is large. Portions of this amorphous element tends to be oxidized naturally and the inside of the semiconductor is oxidized. On the other hand, the sputtering film is very densified and natural oxidation does not advance inside the semiconductor film, only the surface and a region closer to surface are oxidized. This densified micro-structure makes it possible for the distorted lattice crystal grains to be pressed up very close together, not allowing the energy barrier against carriers to be formed along the crystal grain boundaries.

Using SIMS analysis, the quantity of oxygen impurities in the semiconductor film formed with this method is found to be $2 \times 10^{20}$ atoms.cm$^{-3}$, the quantity of carbon was $5 \times 10^{18}$ atoms.cm$^{-3}$, and the quantity of hydrogen mixed in is less than 5%. (The concentration value of the impurities measured using the SIMS method was taken in the direction of depth of the semiconductor, and because the concentration changes in that direction, the values recorded are the minimum values in that direction. The reason for this is thought to be the naturally oxidized film on or closer to the surface of the semiconductor film. The concentration value of the impurities does not change even after crystallization took place.)

It is of course preferable if the concentration of impurities is as low as possible for forming semiconductor devices, however, in the case of the present invention, even if oxygen is included in the semiconductor at $2 \times 10^{20}$ atoms.cm$^{-3}$, the property of the semiconductor such as carrier mobility is not hindered because the semiconductor has a crystalline structure with a distorted lattice so that grain boundaries can be reduced.

Figure 15:
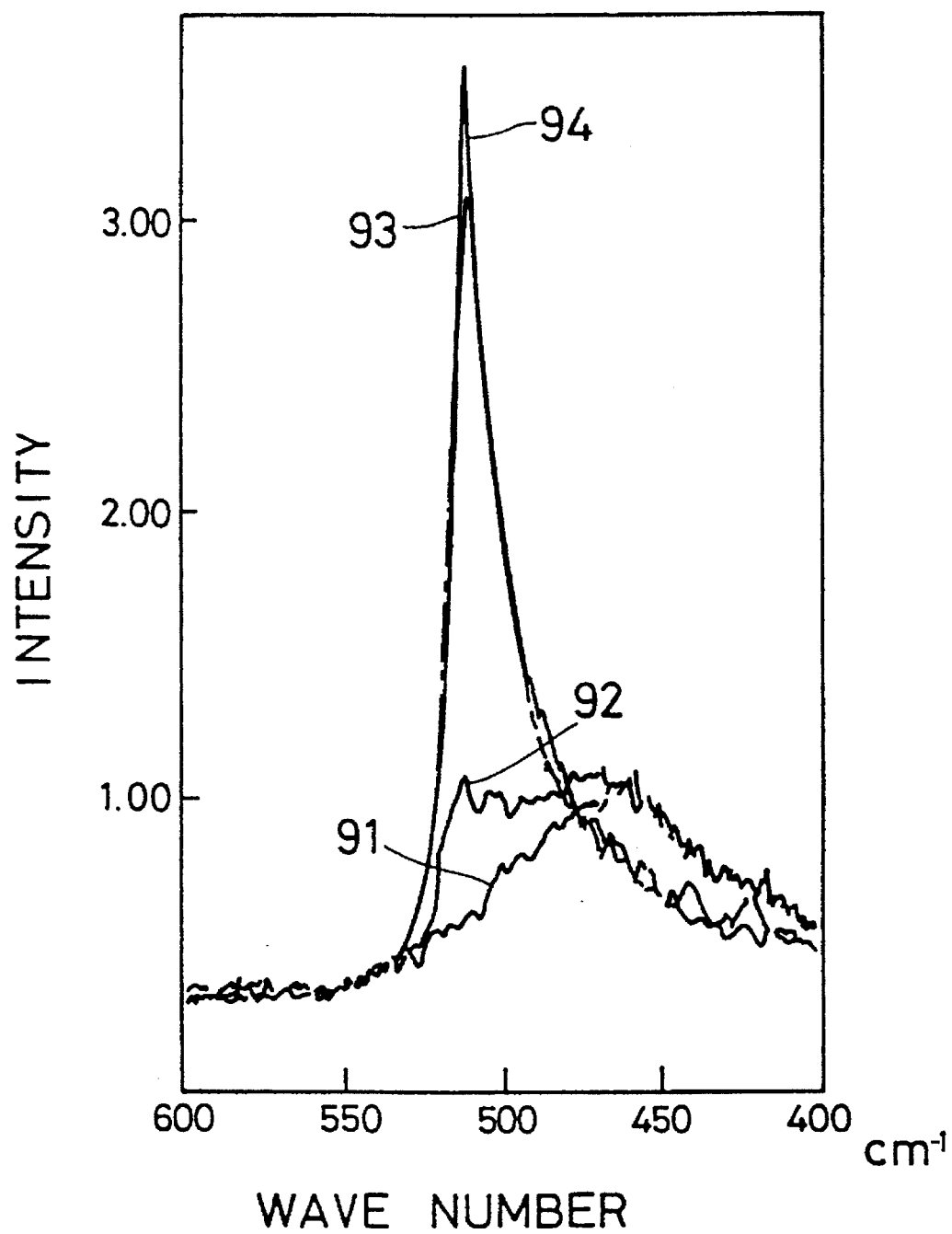
FIG. 15 shows a Raman spectrogram of the semiconductor layer formed in the present invention.

As can be seen from the laser Raman analysis data of this semiconductor film, shown in FIG. 15, the peak indicating the existence of crystals, has shifted to a lower wavenumber when compared to the peak of normal single-crystal silicon (520 cm$^{-1}$), proving the existence of a distorted lattice.

The conditions required during the RF magnetron sputtering for forming the non-single-crystal semiconductor are made clear by the comparison test described below.

In order to investigate the relationship between the hydrogen partial pressure in the sputtering gas used when forming the non-single crystal silicon, and the electrical characteristics of the film, the following 6 comparison tests are performed with the hydrogen partial pressure changed.

| Example number | 1 | 2 | 3 | 4 | 5 | 6 |
|---|---|---|---|---|---|---|
| Partial pressure % | 0 | 5 | 20 | 30 | 50 | 80 |

The partial pressure is calculated as the percentage of hydrogen in the total sputtering gas, $H_2/(H_2+Ar) \times 100\%$. Test 6 corresponds to Embodiment 3. The other conditions are substantially the same as the conditions of Embodiment 3.

Figure 8:
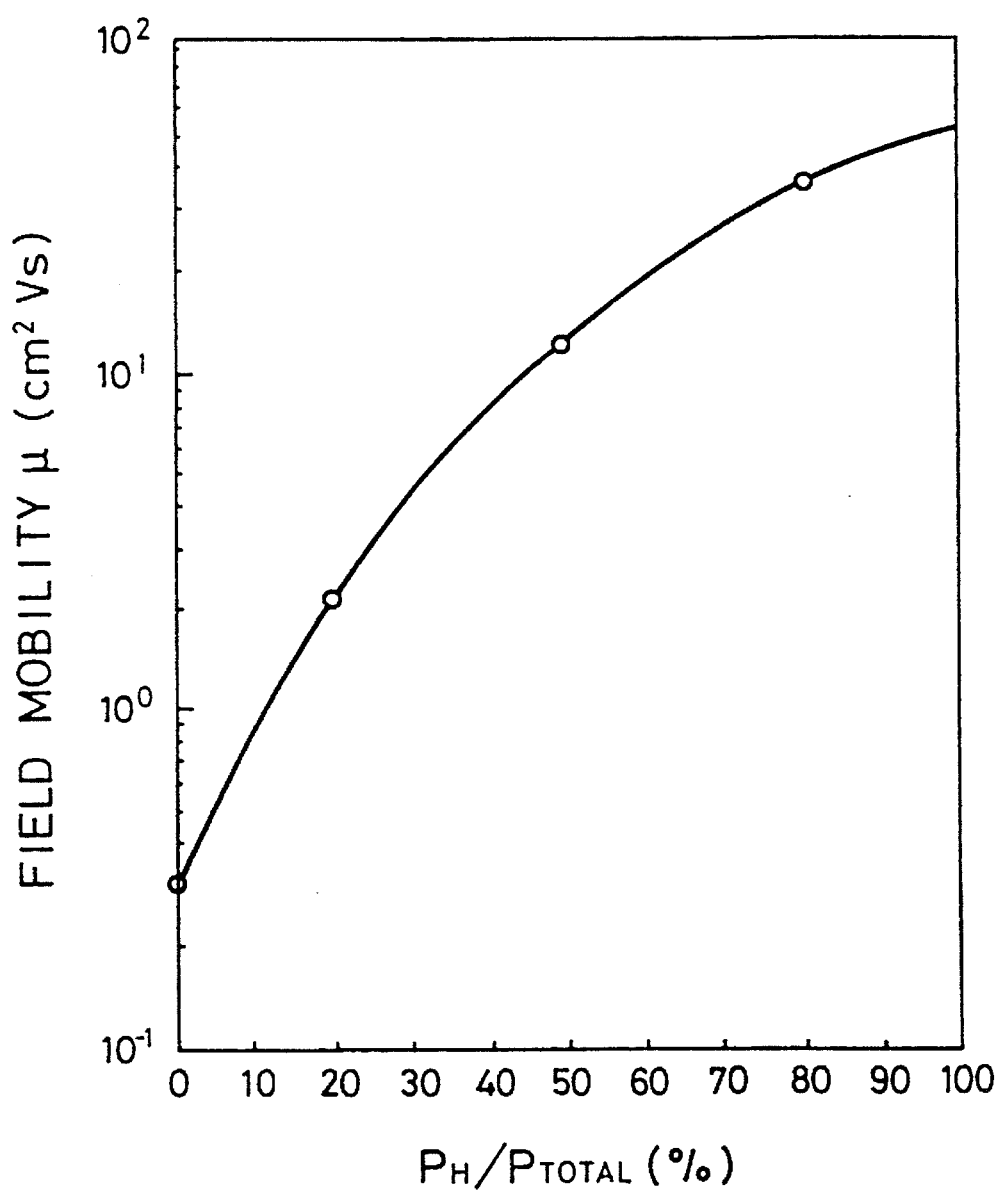
FIG. 8 is a graph to show a relationship between the mobility of the non-single-crystal semiconductor formed by a sputtering method and the partial pressure of hydrogen in the sputtering gas.

FIG. 8 is a graph showing the relationship between the mobility μ of a non-single crystal silicon and the partial pressure ratio ($P_H/P_{TOTAL}=H_2/(H_2+Ar)$) of hydrogen in the sputtering gas. According to FIG. 8, it is seen that remarkably high mobility is obtained when the hydrogen partial pressure is 20% or more.

Figure 9:
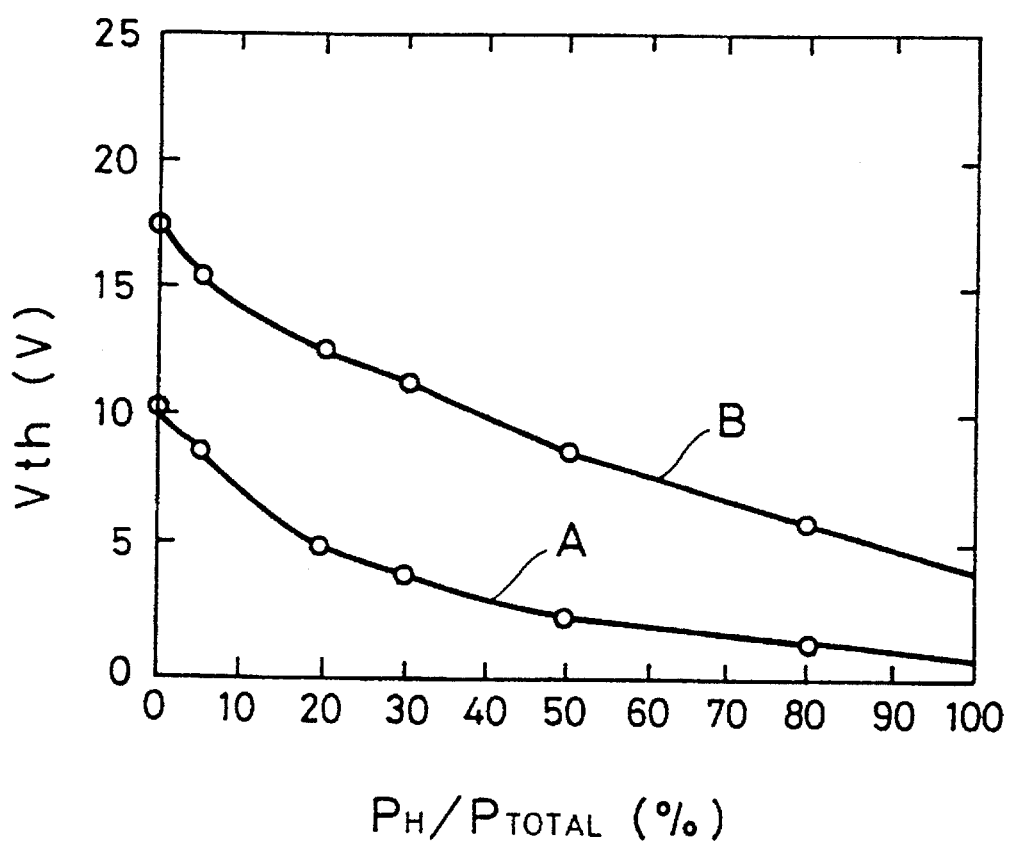
FIG. 9 shows a relationship between the partial pressure of hydrogen in the sputtering gas and the threshold voltage.
Figure 10:
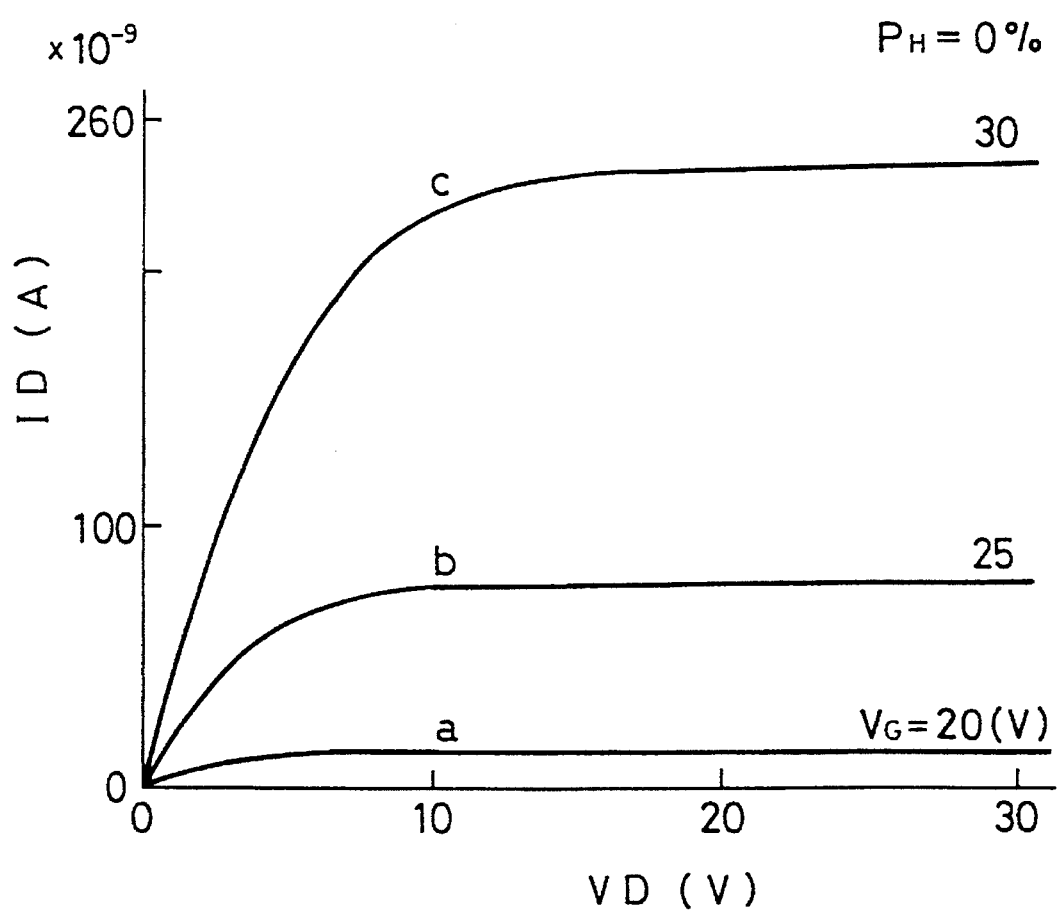
FIGS. 10 to 14 show the characteristics of the TFT source current and the source voltage.

In the graph of FIG. 9, curve A shows the relationship between the threshold voltage Vth and the hydrogen partial pressure ratio. Curve B is used for comparison with the construction of this invention and the case similar to this embodiment except that the oxidized gate film does not have fluorine mixed in.

According to FIG. 9, it can be seen that when a gate insulation film with fluorine mixed in is used, as in the construction of this invention, a lower threshold voltage is obtained when compared with the insulated-gate field-effect transistor which uses the prior art gate insulation film.

The lower the threshold voltage, the lower the voltage needed to operate the thin-film transistor becomes, and is considered to have good characteristics for use as a device. Accordingly, the result in FIG. 9, shows that with a condition of high hydrogen partial pressure in the sputtering gas, a threshold voltage of 2 V or less, in normally off condition, can be obtained. FIG. 9 also shows that the higher the partial pressure of hydrogen the lower the threshold voltage is. In all of the above tests, it is found that when the a-Si film, which becomes the channel formation region, is formed by the sputtering method, and as the hydrogen partial pressure is increased, the electrical characteristics of the device are improved.

FIGS. 10 to 14 show the relationship between the drain voltage and the drain current with a gate voltage as a parameter in the IG-FET formed in the comparison test above.

Figure 11:
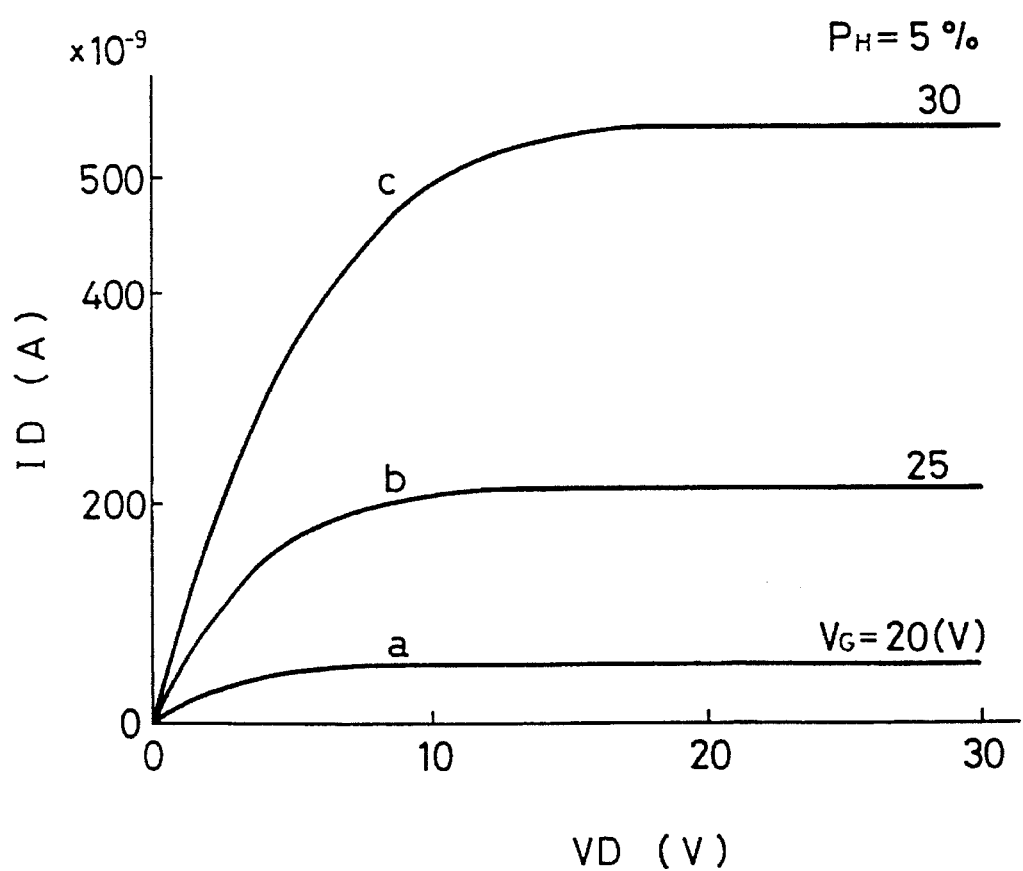
Figure 12:
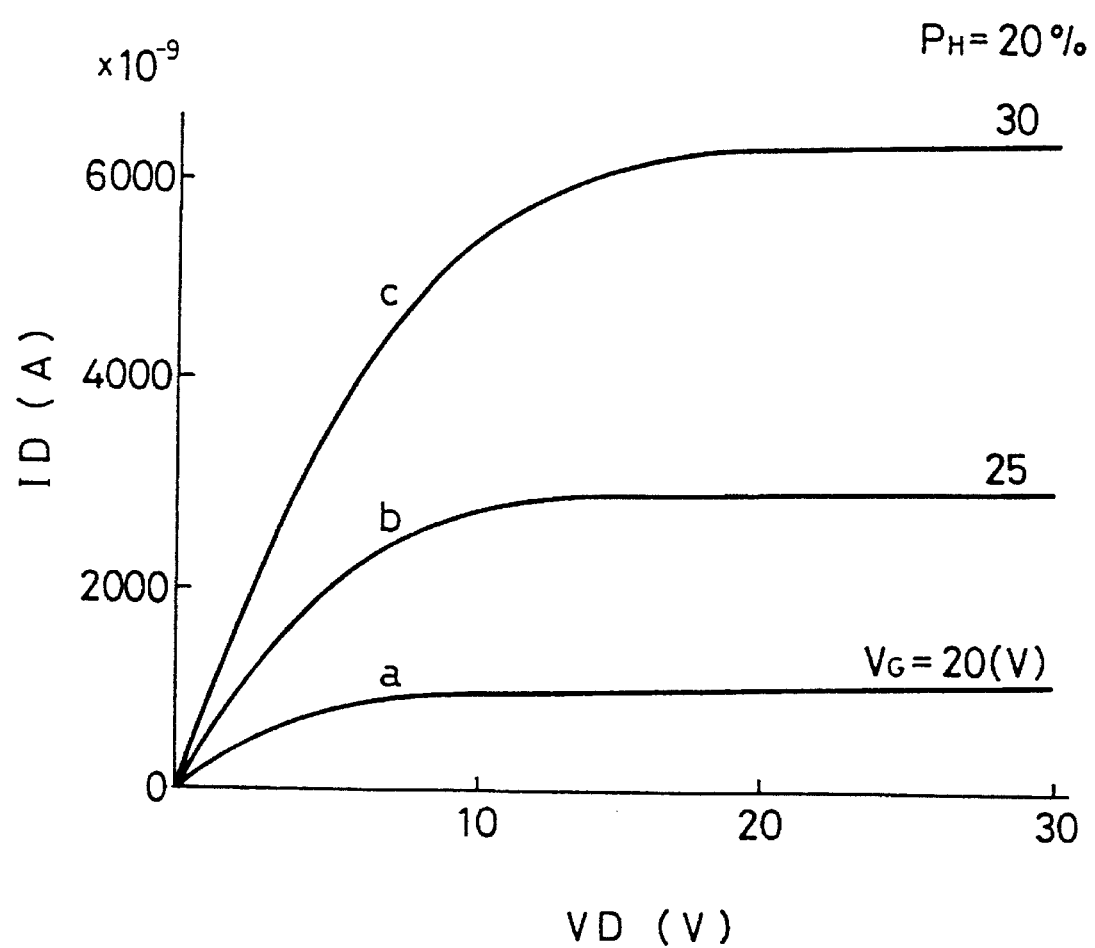

Curves a, b, and c of FIGS. 10 to 14 correspond to gate voltages VG of 20 V, 25 V, and 30 V. The effects of the hydrogen partial pressure can be seen in comparing FIG. 11 (partial pressure 5%) and FIG. 12 (partial pressure 20%). In FIGS. 11 and 12, when the drain currents (curve c) are compared to each other at the gate voltage of 30 V, it can be seen that the drain current when the hydrogen partial pressure is 20% is 10 times larger or more than when the partial pressure is 5%.

From this it is known that when a-Si film 13 in FIG. 4(A) is made, if the partial pressure ratio of hydrogen, added during sputtering, increases from 5% to 20%, the electrical characteristics of the thin-film transistor greatly improve.

FIG. 15 is a Raman spectrogram of the semiconductor layer of the heat crystallized a-Si film with hydrogen partial pressure ratios of 0, 5, 20, and 50%. The curves 91, 92, 93, and 94 correspond to the partial pressure ratios 0, 5, 20, and 50%, respectively.

Looking at FIG. 15 and comparing curve 92 with curve 93, or in other words, comparing hydrogen partial pressure ratios of 5% and 20%, it can be seen that when heat crystallization is performed and the hydrogen partial pressure ratio of the sputtering gas is 20%, the Raman spectrogram remarkably shows the crystal characteristics of the silicon semiconductor.

The average diameter of the crystal grains were, from half-value width, 5 to 400 Å, e.g. 50 to 300 Å. The peak position of the Raman spectrograph is shifted to the lower wavenumber side a little off from the 520 cm$^{-1}$ location of the single crystal silicon peak, which clearly indicates that there is distortion in the lattice. These results remarkably show the characteristics of this invention. That is, the effects of making the a-Si film using the sputtering method with hydrogen gas added, appears only when heat crystallization of the a-Si film takes place.

When the crystalline structure is distorted in the above manner, the barriers which exists at grain boundaries can be eliminated, therefore, the carrier mobility can be improved. Also, the segregation of impurities such as oxygen at the boundaries becomes very difficult to be formed, resulting in that high carrier mobility is possible. For this reason, even if the concentration of impurities in the semiconductor film is in a degree of $2 \times 10^{20}$ atoms.cm$^{-3}$, no barriers against the carrier are formed, and the film can be used as the channel region of an insulated-gate semiconductor.

Figure 13:
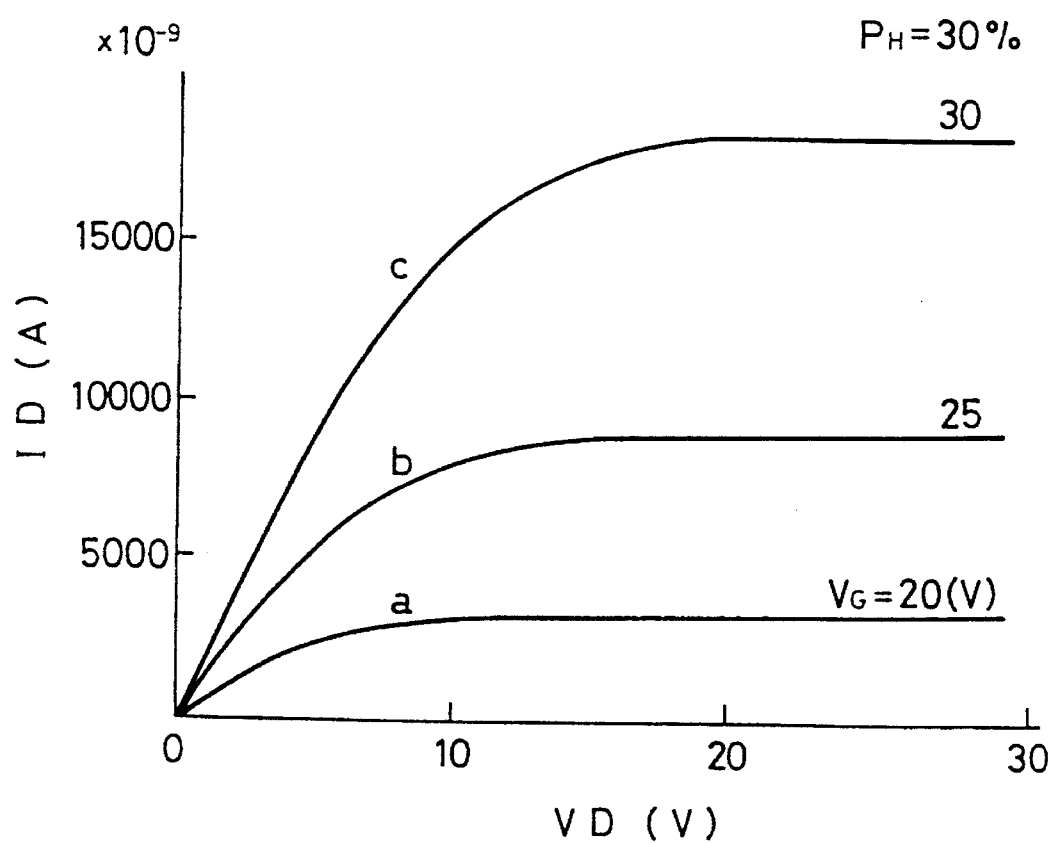
Figure 14:
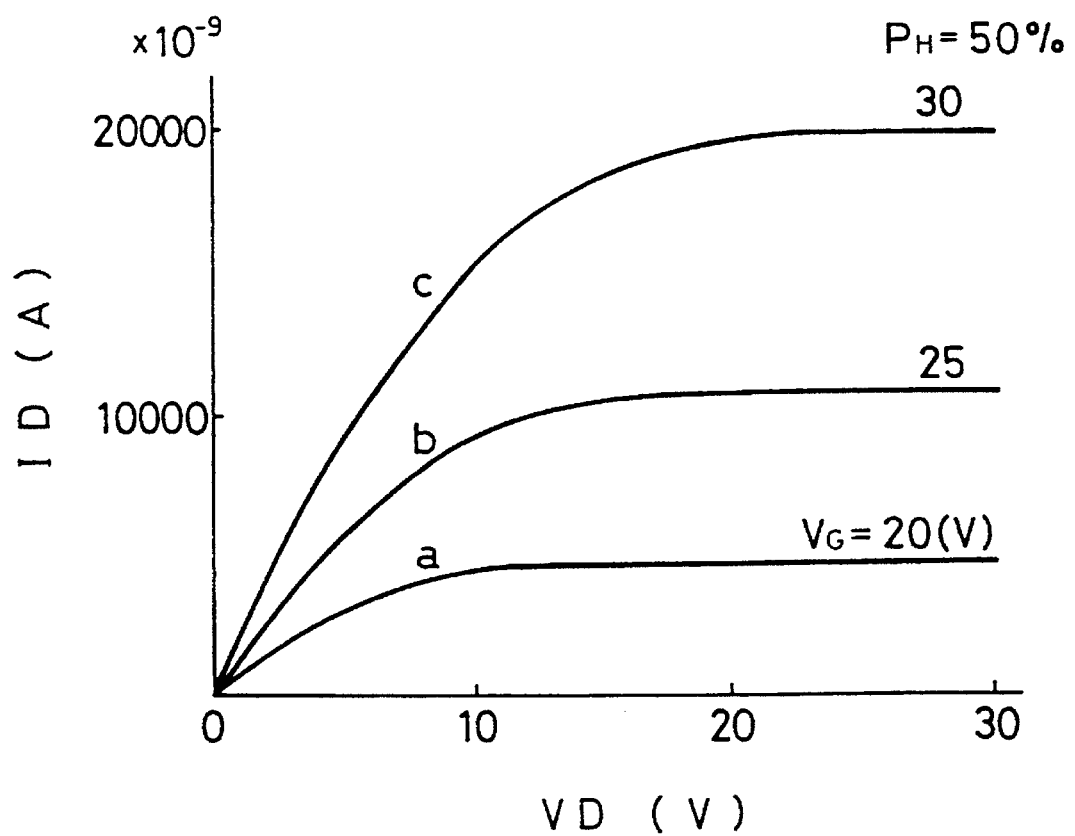

In comparing FIG. 12, 13, and 14, as the hydrogen partial pressure in the sputtering gas increases when forming the a—Si film mentioned above, the drain current becomes large. This is very clear if curves c in FIG. 12, 13, and 14 are compared to each other.

Generally, in a thin-film field-effect transistor, when the drain voltage $V_D$ is low, the relationship between the drain current $I_D$ and the drain voltage $V_D$ is given by the following equation:

$$I_D=(W/L)\mu C(V_G-V_T)V_D \qquad (i)$$

(Solid. State electronics. Vol.24.No.11.pp.1059.1981.Printed in Britain)

In the above equation, W is the channel width, L is the channel length, μ is the carrier mobility, C is the electrostatic-capacitance of the gate oxide film, $V_G$ is the gate voltage, and $V_T$ is the threshold voltage. In the curves of FIG. 10 through 14 the regions near the origin are represented by the above equation (i).

If the hydrogen partial pressure is fixed, the carrier mobility μ and the threshold voltage $V_T$ are fixed, and also, because W, L, and C are values that are fixed depending upon the structures of the thin-film transistor, the variables in equation (i) are $I_D$, $V_G$, and $Y_D$. In the region near the origin of the curves shown in FIG. 10 through 14, $V_G$ is fixed, and so it is seen that the curves are given by equation (i), and this equation describes the curves near the origin of FIGS. 10 through 14. This is because this equation was approximately developed for when the drain voltage $V_D$ is low.

According to equation (i), as the threshold voltage $V_T$ is lower and, the mobility μ gets larger, the slope of the curves increases. This is clearly shown when the curves of FIG. 10 through 14 are compared based on the mobility and threshold voltages of FIG. 8 and 9.

According to equation (i), it can be seen that the electrical characteristics of the thin-film transistor depend on and $V_T$. Therefore, the device characteristics cannot be decided from FIGS. 8 and 9 separately. When the slopes of the curves near the origin of FIG. 10 through 14 are compared to each other, it is clearly seen and concluded that it is good if the hydrogen partial pressure ratio of the sputtering gas, used when forming the a-Si film that will become the channel formation region, is 20% or more, if possible 100%.

Data showing the effects of this invention is shown below in Table 1.

TABLE 1

| Hydrogen Partial Pressure Ratio | S Value | Vth | Mobility | On/Off Ratio |
| --- | --- | --- | --- | --- |
| 0 | 2.5 | 10.6 | 0.30 | 5.4 |
| 5 | 2.4 | 7.9 | 0.46 | 5.7 |
| 20 | 1.6 | 4.9 | 2.11 | 6.7 |
| 30 | 1.1 | 4.5 | 3.87 | 6.9 |
| 50 | 0.78 | 2.5 | 10.1 | 6.9 |
| 80 | 0.49 | 1.9 | 35.1 | 6.2 |

In Table 1, the hydrogen partial pressure ratio is the atmosphere condition in the magnetron RF sputtering method used when forming the a-Si film 13 of FIG. 4(A) which becomes the channel formation region 17 of FIG. 4(D) of this embodiment.

The S value is the minimum value of $[d(I_D)/d(V_G)]^{-1}$ of the initial rise slope of the curves of the graphs that show the relationship between the gate voltage ($V_G$) and the drain current ($I_D$), which describes the characteristics of the device. As this value gets smaller, the inclination of the curves showing the ($V_G$–$I_D$) characteristics becomes sharper, and the electrical characteristic of the device is high.

The on/off characteristic is the log of the minimum ratio value of the drain current, which occurs at a certain gate voltage and fixed drain voltage, and the drain current when the gate voltage is varied at the same fixed drain voltage.

According to Table 1, considering everything, it can be seen that in order to obtain a high performance semiconductor using the method of this embodiment, a condition of hydrogen partial pressure ratio of 80% or more is adequate to be adopted.

This invention has been explained using the silicon semiconductor of this embodiment, however, using germanium semiconductor, and a silicon-germanium mixture semiconductor is also possible, and in this case the temperature for heat crystallization can be lowered by about 100° C.

Also, in forming a more densified semiconductor film or silicon oxide film in the above mentioned hydrogen atmosphere or in a hydrogen and inert gas atmosphere during sputtering, intense light or laser irradiation, of 1000 nm or less, can also be applied continuously or in pulses, to the substrate or the sputtered and flying target particles.

Embodiment 4

Figure 16:
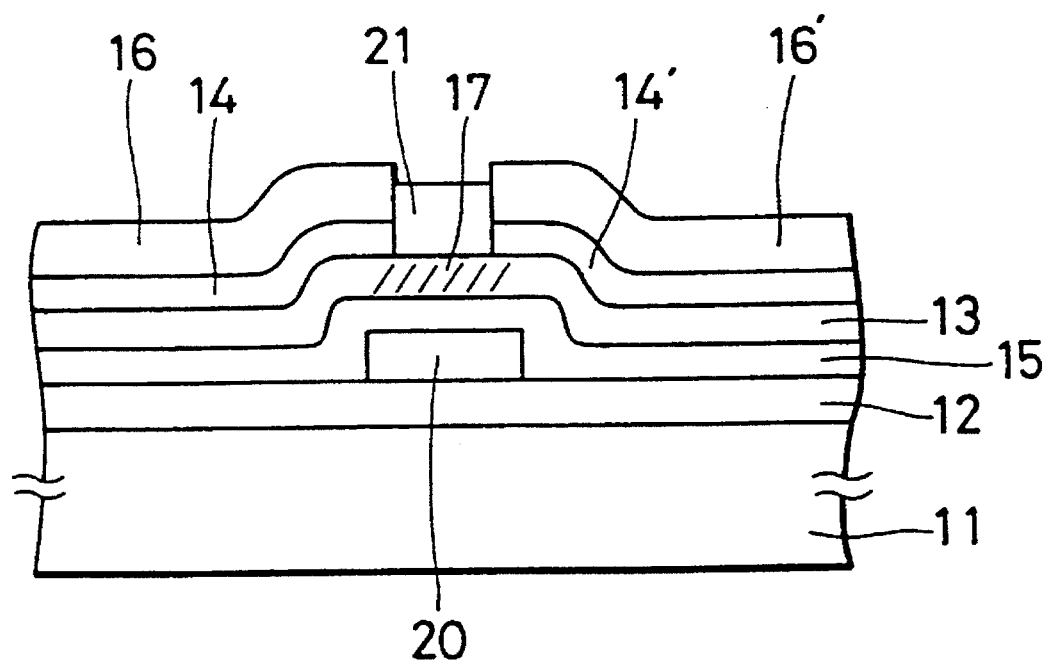
FIG. 16 is a cross sectional view of a part of the structure produced by a fourth embodiment of a manufacturing process of the thin-film transistor in the present invention.

In this embodiment, an insulated-gate type semiconductor device is formed as shown in FIG. 16.

Coating the insulated substrate with a silicon oxide film is done in the same process as in Embodiment 1, however, in this embodiment the formation of the gate insulation film is finished before the formation of the semiconductor layer which forms the channel region. On a surface of an insulation film 12, 3000 Å thick metallic molybdenum is formed by a sputtering method, then a prescribed patterning is performed, so that gate electrode 20 is formed.

Then, a 100 nm thick gate oxide film (SiO$_2$) 15 is formed by a magnetron RF sputtering method in the conditions below.

Oxygen 95% NF$_3$ 5%
Pressure: 0.5 Pa
Formation Temperature: 100 C.
RF(13.56 MHz) Power Output: 400 W A silicon target or synthetic quartz target is used.

On a surface of the silicon oxide film, a 100 nm thick a-Si film 13, which will become a channel formation region, is formed by a magnetron RF sputtering. The conditions of formation are as shown below in an inert argon and hydrogen gas atmosphere.

H$_2$/(H$_2$+Ar)=80% (partial pressure ratio)

Formation Temperature: 150° C.

RF (13.56 MHz) Output: 400 W

Total Pressure: 0.5 Pa

The target used is made of poly-crystalline or non-single crystalline silicon.

After the formation of the a-Si film 13, the laminar structure is annealed for 10 hours in an atmosphere of hydrogen or inactive gas, for example, in an N$_2$ atmosphere at a temperature in the range of 450°–700° C., specifically, at 600° C., as a result, the a-Si film 13 is crystallized. When the semiconductor layer formed by this method is analyzed by SIMS analysis, the quantity of oxide impurities existing in the semiconductor layer is found to be 1×10$^{20}$ atoms.cm$^{-3}$, the quantity of carbon is 4×10$^{18}$ atoms.cm$^{-3}$, and the amount of hydrogen is 5% or less. In so doing, the channel region 17 is formed over the gate electrode 20.

Next a 50 nm thick n$^+$ a-Si film 14 is formed in the following conditions by a magnetron RF sputtering method.

The conditions of film formation are as follows and in an atmosphere of hydrogen partial pressure ratio of 10 to 99% or more (in this example 80%), and argon partial pressure ratio 10 to 99% (in this example 19%).

Formation Temperature: 150° C.

RF (13.56 MHz) Power Output: 400 W

Total Pressure: 0.5 Pa

The target used is single-crystal silicon doped with phosphorus.

Next on the semiconductor layer 14, an aluminum layer as source and drain electrodes is formed, patterning is performed, and the source and drain impurity regions 14 and 14' as well as the source and drain electrodes 16 and 16' are formed, wherein the semiconductor device is completed.

In this embodiment, because the gate insulation is formed before the semiconductor layer for the channel formation region, the boundary regions between the gate insulation film and the channel region are moderately heat annealed during the heat crystallization process, thus making it possible to lower the density of boundary levels.

Also in the aforementioned sputtering method, the inert gas used is argon, however other inert gasses such as helium can be used, or reactive gasses such as SiH$_4$ or Si$_2$H$_6$ which have been made plasmatic can also be used.

Also in the magnetron RF sputtering method used for forming the a-Si film, the concentration of hydrogen is in the range of 20 to 100%, the film formation temperature is in the range of 50° to 500° C., the RF power output is in the range of 1 W to 10 MW at a frequency in the range of 500 Hz to 100 GHz. The values within these ranges can be freely selected, in addition it is possible to use a pulse energy source.

Also, the hydrogen gas used for the sputtering can be converted to plasma more effectively by the use of an intense light (having wavelength 1000 nm or less) or an electron cyclotron resonance (ECR). By making the hydrogen more plasmatic, the efficiency of the positive ions in sputtering is higher and thus micro structures in the film formed by sputtering can be prevented, in the case of this embodiment, micro structures in the a-Si film, can be prevented. This is also applicable to the other process gasses.

In the embodiments, the a-Si is utilized as the non-crystalline semiconductor, however, other semiconductors such as germanium or a silicon-germanium mixture $Si_xGe_{1-x}$ (0<x<1) can also be used.

Also it need not to be said that, the present invention can be used in stagger-type, coplanar-type, reverse-stagger-type, and reverse-coplanar-type insulated-gate field effect transistors.

Furthermore, FET is mentioned here but this invention is not limited to FET but also be used in the insulated film of other semiconductor devices such as DRAM. In the above embodiments, in order for the Na or K neutralization, the halogen gasses such as fluorine are used, however, other gasses such as phosphorus, carbon, or nitrogen with a density of $1\times10^{19}$ to $5\times10^{20}$ atomic % can also be used. Also in the above embodiments the insulation film used is $SiO_2$, however, according to specific needs, alumina, tantalum oxide, barium titanate, or silicon nitride can be used in the same way.

What is claimed is:

1. A method for manufacturing an insulated gate field effect transistor comprising the steps of:

forming an impurity blocking layer on an insulating substrate;

forming a non-single crystalline semiconductor layer to become source, drain and channel regions;

forming a gate insulating layer on said non-single semiconductor layer, wherein said blocking layer contains a halogen element.

2. The method of claim 1 wherein said gate insulating layer contains a halogen element.

3. The method of claim 1 wherein said blocking film comprises silicon oxide.

4. A method for forming an insulated gate field effect transistor comprising the steps of:

forming a protective film on a substrate;

forming a channel semiconductor layer comprising non-single crystalline semiconductor on said protective film; and forming a gate insulating layer comprising silicon oxide adjacent to said channel semiconductor layer, wherein both of said gate insulating layer and said protective film contain a halogen element.

5. A method for forming an insulated gate field effect transistor comprising the steps of:

forming a protective film on a substrate;

forming a channel semiconductor layer comprising non-single crystalline semiconductor on said protective film; and forming a gate insulating layer comprising silicon oxide by sputtering a synthetic quartz in an oxidizing atmosphere adjacent to said channel semiconductor layer, wherein both of said gate insulating layer and said protective film contain a halogen element.

6. A method for forming an insulated gate field effect transistor comprising:

forming a protective film on a substrate;

forming a channel semiconductor layer comprising non-single crystalline semiconductor on said protective film;

forming a gate insulating layer comprising silicon oxide on said semiconductor layer; and annealing said gate insulating layer with a laser light, wherein said protective film contains a halogen element.

7. The method of claim 6 wherein said laser light is an excimer laser light.

8. The method of claims 4, 5, 6, or 1 wherein said halogen element is chlorine.

9. The method of claims 4, 5, 6 or 1 wherein said halogen element is fluorine.

10. The method of claims 4, 5, 6 or 1 wherein said substrate is a glass substrate.

11. The method of claims 4, 5, or 6 wherein said protective film comprises silicon oxide.

12. The method of claim 4, 5, 6 or 1 wherein said halogen element is contained at a concentration not higher than 5 atom %.

13. The method of claim 1 wherein said gate insulating layer comprises silicon oxide.

14. The method of claim 1 wherein said gate insulating layer comprises a material selected from the group consisting of alumina, tantalum oxide, barium titanate and silicon nitride.

* * * * *